US012550307B2

(12) United States Patent
Takamiya et al.

(10) Patent No.: US 12,550,307 B2
(45) Date of Patent: Feb. 10, 2026

(54) MANAGEMENT DEVICE, INSTALLATION-RELATED DEVICE, INSTALLATION SYSTEM, MANAGEMENT METHOD, AND METHOD FOR CONTROLLING INSTALLATION-RELATED DEVICE

(71) Applicant: FUJI CORPORATION, Chiryu (JP)

(72) Inventors: Hideyasu Takamiya, Chiryu (JP);
Taira Yonekubo, Nagoya (JP);
Yasuhiko Ota, Kuwana (JP)

(73) Assignee: FUJI CORPORATION, Chiryu (JP)

( * ) Notice: Subject to any disclaimer, the term of this patent is extended or adjusted under 35 U.S.C. 154(b) by 735 days.

(21) Appl. No.: 17/905,576

(22) PCT Filed: Mar. 11, 2020

(86) PCT No.: PCT/JP2020/010614
§ 371 (c)(1),
(2) Date: Sep. 2, 2022

(87) PCT Pub. No.: WO2021/181576
PCT Pub. Date: Sep. 16, 2021

(65) Prior Publication Data
US 2023/0125782 A1    Apr. 27, 2023

(51) Int. Cl.
*B23P 19/00*    (2006.01)
*H05K 13/04*    (2006.01)
*H05K 13/08*    (2006.01)

(52) U.S. Cl.
CPC ....... *H05K 13/0882* (2018.08); *H05K 13/086* (2018.08); *H05K 13/0888* (2018.08)

(58) Field of Classification Search
CPC ............... H05K 13/021; H05K 13/086; H05K 13/0882; H05K 13/0888
See application file for complete search history.

(56) References Cited

U.S. PATENT DOCUMENTS 11,991,832 B2 * 5/2024 Oyama ................ H05K 13/021
2009/0259333 A1 * 10/2009 Yano ...................... G06Q 10/10
700/121

(Continued)

FOREIGN PATENT DOCUMENTS

| CN | 110431928 A | 11/2019 |
| JP | 2010-192772 A | 9/2010 |

(Continued)

OTHER PUBLICATIONS

International Search Report Issued Jun. 2, 2020, in PCT/JP2020/010614, filed on Mar. 11, 2020, 2 pages.

*Primary Examiner* — Paul D Kim
(74) *Attorney, Agent, or Firm* — Oblon, McClelland, Maier & Neustadt, L.L.P.

(57) ABSTRACT

A management device of the present disclosure is used in a mounting system including multiple mounting-related devices each including a display section configured to visually notify an operator of information and an attachment portion to which a member is attached and related to a process of mounting a component on a processing target object, and a moving work device configured to move between the multiple mounting-related devices to automatically attach and detach the member to and from the attachment portion. The management device includes a management control section configured to, when a mounting-related device is in a restriction state in which work of the operator on the mounting-related device is not accepted due to movement of the moving work device, display a display mode indicating the restriction state on the display section of the corresponding mounting-related device to notify the operator of the restriction state.

10 Claims, 5 Drawing Sheets

(56) References Cited

U.S. PATENT DOCUMENTS

| | | |
|---|---|---|
| 2016/0214259 A1* | 7/2016 | Yamamoto ............ B25J 9/1674 |
| 2020/0125073 A1 | 4/2020 | Nozawa |
| 2020/0253101 A1 | 8/2020 | Kuroda |
| 2021/0120714 A1 | 4/2021 | Brown |

FOREIGN PATENT DOCUMENTS

| | | |
|---|---|---|
| WO | WO 2018/173204 A1 | 9/2018 |
| WO | WO 2019/087391 A1 | 5/2019 |
| WO | WO 2019/176038 A1 | 9/2019 |

* cited by examiner

MANAGEMENT DEVICE, INSTALLATION-RELATED DEVICE, INSTALLATION SYSTEM, MANAGEMENT METHOD, AND METHOD FOR CONTROLLING INSTALLATION-RELATED DEVICE

TECHNICAL FIELD

The present specification discloses a management device, a mounting-related device, a mounting system, a management method, and a method for controlling the mounting-related device.

BACKGROUND ART

In the related art, as a mounting system, there has been proposed a mounting line having multiple mounting devices that mount components on boards arranged in a predetermined arrangement direction, a supply device (moving work device) that conveys members used in the mounting device by being moved in the arrangement direction to supply the members to the mounting devices, and a display section that is disposed in each of the mounting devices and changes a display mode in accordance with movement of the supply device (refer to Patent Literature 1, for example). In this mounting system, it is possible to recognize that an obstacle obstructs an operation of the supply device based on a display mode of the display section, and thus to prompt an operator to take an appropriate action.

PATENT LITERATURE

Patent Literature 1: International Publication No. WO2018/173204

BRIEF SUMMARY

Technical Problem

In the mounting system disclosed in Patent Literature 1 described above, a movement direction or the like of the moving work device can be recognized, but it has not been considered to provide notifications of other information. In this mounting system, it has been demanded to provide notifications of device states corresponding to various situations.

The present disclosure has been made in view of such problems, and a principal object of the present disclosure is to provide a management device, a mounting-related device, a mounting system, a management method, and a method for controlling the mounting-related device, capable of easily visually recognizing a state of the mounting-related device that changes in accordance with movement of a moving work device.

Solution to Problem

The present disclosure employs the following means in order to achieve the above principal object.

According to the present disclosure, there is provided a management device used in a mounting system including multiple mounting-related devices and a moving work device, the multiple mounting-related devices each including a display section configured to visually notify an operator of information and an attachment portion to which a member is attached, the multiple mounting-related devices being related to a process of mounting a component on a processing target object, the moving work device being configured to move between the multiple mounting-related devices to automatically attach and detach the member to and from the attachment portion, the management device including a management control section configured to, when a mounting-related device is in a restriction state in which work of the operator on the mounting-related device is not accepted due to movement of the moving work device, display a display mode indicating the restriction state on the display section of the corresponding mounting-related device to notify the operator of the restriction state.

Generally, in a mounting-related device related to a mounting process, since movement and an exchange operation of the moving work device are performed in the vicinity of the mounting-related device, work on the mounting-related device by an operator may be restricted. However, it is not easy for the operator to recognize which mounting-related device is operable and which device is in a restriction state. In this management device, when the mounting-related device is in the restriction state in which work of the operator is not accepted due to movement of the moving work device, a display mode indicating the restriction state is displayed on the display section of the corresponding mounting-related device to notify the operator of the restriction state. Therefore, in this management device, a state of the mounting-related device changed due to movement of the moving work device can be easily visually recognized. Here, the mounting-related device includes, for example, a printing device that prints a viscous fluid on a processing target object, a print inspection device that inspects a printing state or the like, a mounting device that performs a process of mounting a component, a mounting inspection device that inspects a mounting state or the like, a storage device that stores members used in the device, a conveyance device for a processing target object, and a reflow device for performing a reflow process. Examples of the processing target object include a board and a base material having a three-dimensional structure.

DESCRIPTION OF EMBODIMENTS

Figure 1:
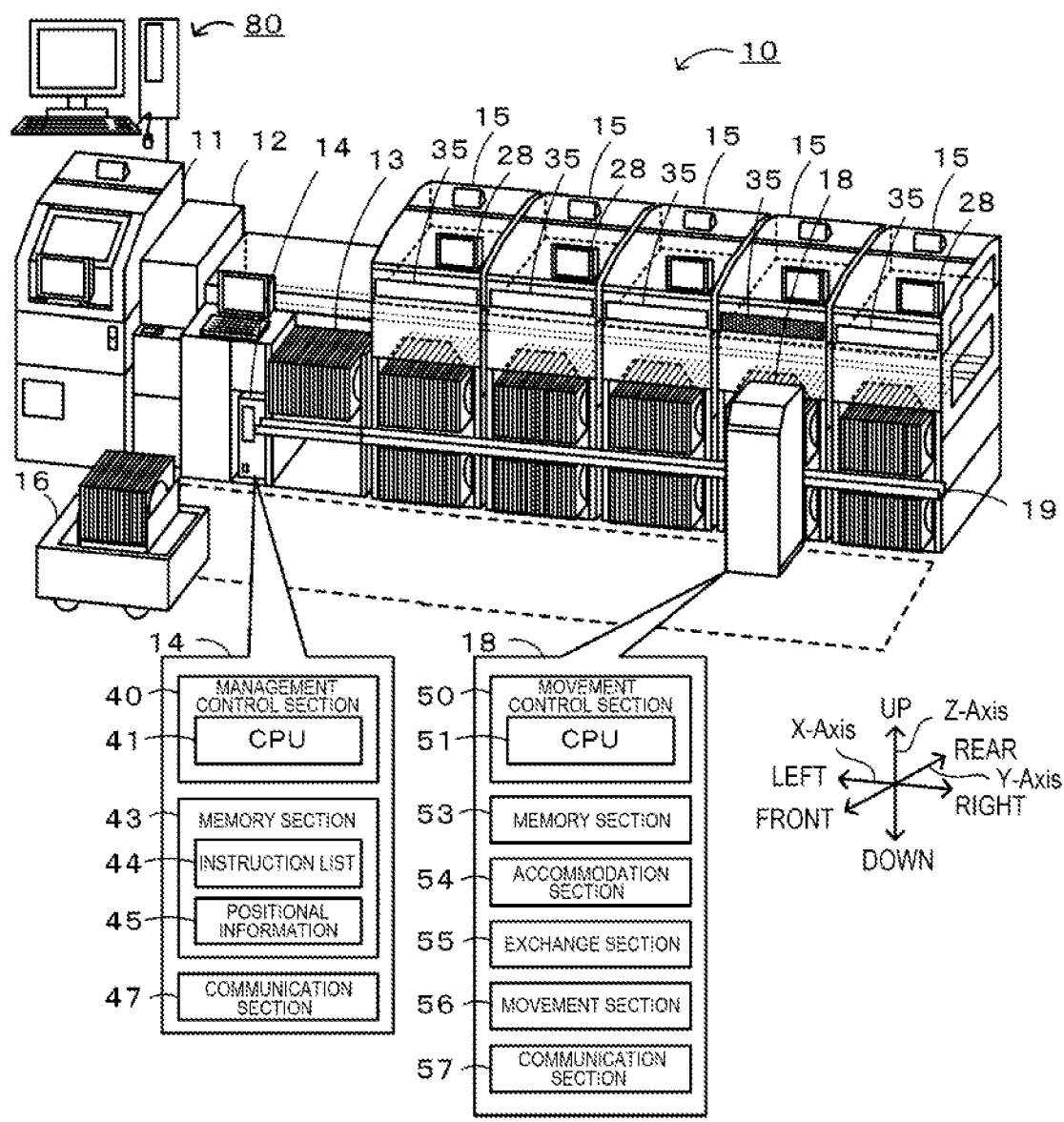
FIG. 1 is a schematic explanatory diagram illustrating an example of mounting system 10.
Figure 2:
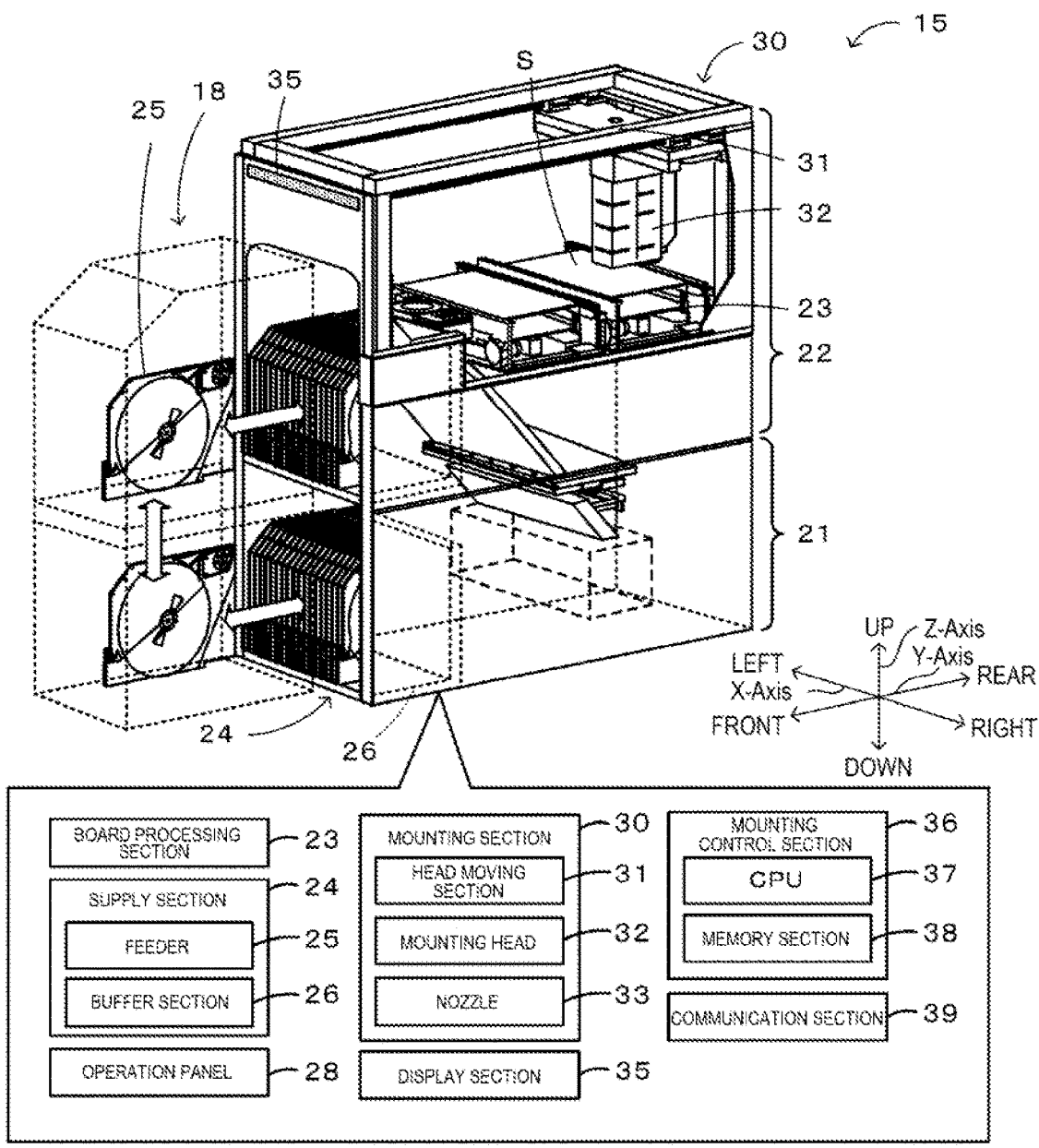
FIG. 2 is an explanatory diagram schematically illustrating a configuration of mounting device 15.

Hereinafter, the present embodiment will be described with reference to the drawings. FIG. 1 is a schematic explanatory diagram illustrating an example of mounting system 10 of the present disclosure. FIG. 2 is an explanatory diagram schematically illustrating a configuration of mounting device 15. In the present embodiment, a left-right direction (X-axis), a front-rear direction (Y-axis), and an up-down direction (Z-axis) are as illustrated in FIGS. 1 and 2.

Mounting system 10 is configured, for example, as a production line in which mounting devices 15 performing a process of mounting components P on board S serving as a processing target object are arranged in a conveyance direction of board S. Here, a processing target object will be described as board S, but the processing target object is not particularly limited as long as it is a board on which component P is mounted, and may be a base material having a three-dimensional shape. As illustrated in FIG. 1, mounting system 10 includes printing device 11, print inspection device 12, storage section 13, management PC 14, mounting device 15, mounting inspection device (not illustrated), reflow device (not illustrated), automatic conveyance vehicle 16, loader 18, host PC 80, and the like. Printing device 11 is a device that prints a solder paste or the like on board S. Print inspection device 12 is a device that inspects a state of the printed solder. The mounting inspection device is a device that inspects a state or the like of a component that has been subjected to a mounting process. The reflow device is a device that reflows a board on which a solder is printed and on which a component is mounted. Host PC 80 is configured as a server that stores and manages information used by each device of mounting system 10, such as a production plan database including multiple pieces of mounting condition information.

Mounting device 15 is a device that picks up component P and mounts component P on board S. As illustrated in FIG. 2, mounting device 15 includes base 21 fixed to a mounting location, and module 22 disposed on base 21. Module 22 is slidably disposed on base 21 ahead of base 21, and is configured to be accessible to an operator by being slid ahead even in a state of being incorporated in a production line. Mounting device 15 includes board processing section 23, component supply section 24, operation panel 28, mounting section 30, display section 35, mounting control section 36, and communication section 39.

Board processing section 23 is a unit that carries in, conveys, fixes board S at a mounting position, and carries out board S. Component supply section 24 is a unit that supplies component P to mounting section 30. Component supply section 24 attaches feeder 25 including a reel around which a tape serving as a holding member holding component P is wound to at least one attachment portion. Component supply section 24 includes a mounting attachment portion to which feeder 25 used for a mounting process is attached and buffer section 26 having a buffer attachment portion to which spare feeder 25 is attached in an upper and lower stage. Feeder 25 includes a controller (not illustrated). The controller stores information such as an ID of a tape included in feeder 25, and the type and the remaining number of components P. When feeder 25 is attached to the attachment portion, the controller transmits information regarding feeder 25 to mounting control section 36. Component supply section 24 may include a tray unit having a tray as a holding member on which multiple components P are arranged and placed. Operation panel 28 is configured as a touch panel having functions of a display section displaying a screen and an operation section receiving an input operation from an operator, and displays an operation state and a setting state of mounting device 15 on a screen.

Mounting section 30 is a unit that picks up component P from component supply section 24 and disposes component P on board S fixed to board processing section 23. Mounting section 30 includes head moving section 31, mounting head 32, and nozzle 33. Head moving section 31 includes a slider that is moved in the XY directions while being guided by a guide rail, and a motor driving the slider. Mounting head 32 picks up one or more components P and is moved in the XY directions by head moving section 31. Mounting head 32 is detachably attached to the slider. One or more nozzles 33 are detachably attached to a lower surface of mounting head 32. Nozzle 33 picks up component P by using a negative pressure. A pickup member that picks up component P may be a mechanical chuck or the like that mechanically holds component P in addition to nozzle 33.

Display section 35 is disposed on a front face of mounting device 15, which is a passage face through which loader 18 passes. Display section 35 may be an LED tape that is a one-dimensional (linear) light emitting member capable of emitting light of various colors. The LED tape has a one-dimensional linear shape, and visually notifies an operator of information in a light emitting manner instead of displaying characters or graphics. In display section 35, for example, a state of mounting device 15 and a display mode are correlated with each other, and when mounting device 15 enters various device states, display modes correlated therewith are set to be displayed. Here, display modes of display section 35 include, for example, a difference in light emission mode such as constant lighting, blinking at different time intervals, flow lighting in a predetermined direction (sequential lighting), a difference in light emission color, and a combination of these. The correspondence between display modes of display section 35 and various device states can be selected by an operator by operating operation panel 28.

Mounting control section 36 is configured as a microprocessor centered on CPU 37, and controls the entire device. Mounting control section 36 has memory section 38. Memory section 38 stores mounting condition information (production job) including information such as information of components P, an arrangement order in which components P are mounted on board S, an arrangement position, and an attachment position of feeder 25 from which components P are picked up. Mounting control section 36 outputs control signals to board processing section 23, component supply section 24, mounting section 30, and display section 35, and receives signals from board processing section 23, component supply section 24, and mounting section 30. Communication section 39 is an interface that exchanges information with external devices such as management PC 14, loader 18, and host PC 80.

Storage section 13 is a storage place for temporarily storing feeder 25 used in mounting device 15. Storage section 13 is provided under the conveyance device between print inspection device 12 and mounting device 15. Storage section 13 has an attachment portion in the same manner as component supply section 24. When feeder 25 is connected to the attachment portion, the controller of feeder 25 outputs information regarding feeder 25, and management PC 14 receives the output information. In storage section 13, feeder 25 may be transported by automatic conveyance vehicle 16 or feeder 25 may be transported by an operator. Automatic conveyance vehicle 16 automatically conveys feeder 25, a member used in mounting system 10, and the like between a warehouse (not illustrated) and storage section 13. The warehouse stores feeder 25, other members, and the like.

Management PC 14 is a device for managing loader 18 and feeder 25. Management PC 14 includes management control section 40, memory section 43, and communication section 47. Management control section 40 is configured as a microprocessor centered on CPU 41 and controls the entire device. Memory section 43 stores instruction list 44 and positional information 45. Instruction list 44 includes a work list executed by loader 18. The work list includes information such as an attachment position or a work order of feeder 25 to be collected or provided. Positional information 45 includes information of the current position of loader 18. Communication section 47 is an interface that exchanges information with external devices such as mounting device 15, loader 18, and host PC 80. Management PC 14 acquires information of the current position from loader 18 at predetermined time intervals, and stores the information in positional information 45.

Loader 18 is a mobile work device, which moves in a moving region in front of mounting system 10 (refer to dashed lines in FIG. 1), and is a device automatically attaching and detaching, collecting and providing members necessary for a mounting process, such as feeder 25 of mounting device 15. Loader 18 includes movement control section 50, memory section 53, accommodation section 54, exchange section 55, movement section 56, and communication section 57. Movement control section 50 is configured as a microprocessor centered on CPU 51 and controls the entire device. Movement control section 50 controls the entire device such that feeder 25 is collected from component supply section 24 or feeder 25 is provided to component supply section 24, and feeder 25 is moved to and from storage section 13. Memory section 53 is, for example, an HDD that stores various data such as a processing program. Accommodation section 54 has an accommodation space for accommodating feeder 25. Accommodation section 54 is configured to be able to accommodate, for example, four feeders 25. Exchange section 55 is a mechanism that moves feeder 25 in and out as well as moving feeder 25 to upper and lower stages (refer to FIG. 2). Exchange section 55 has a clamp portion that clamps feeder 25, a Y-axis slider that moves the clamp portion in the Y-axis direction (front-rear direction), and a Z-axis slider that moves the clamp portion in the Z-axis direction (up-down direction). Exchange section 55 executes attachment and detachment of feeder 25 at the mounting attachment portion, and attachment and detachment of feeder 25 at the buffer attachment portion. Movement section 56 is a mechanism that moves loader 18 in the X-axis direction (left-right direction) along X-axis rail 19 disposed in front of mounting device 15. Communication section 57 is an interface that exchanges information with external devices such as management PC 14 and mounting device 15. Loader 18 outputs the current position or details of executed operations to management PC 14. Loader 18 is capable of collecting and providing feeder 25, but may be configured to collect and provide members related to the mounting process, such as mounting head 32, nozzle 33, a solder cartridge, a screen mask, and a backup pin for supporting a board.

Next, an operation of mounting system 10 of the present embodiment configured as described above, first, a process in which mounting device 15 mounts component P on board S will be described. When a mounting process is started, CPU 37 of mounting control section 36 controls board processing section 23 such that board S is carried in and fixed. Next, CPU 37 reads mounting condition information, causes mounting head 32 to pick up component P from feeder 25 attached to component supply section 24 based on the mounting condition information, and performs a process of disposing component P on board S. When component P is disposed on board S, CPU 37 causes board S to be discharged to board processing section 23 and to carry the next board S into board processing section 23 as described above. CPU 37 manages the number of components used by each feeder 25 during the execution of the mounting process, and when the remaining number of components is equal to or less than a predetermined value, transmits the information to management PC 14. Management PC 14 performs, for example, a process of adding an exchange operation for feeder 25 close to component shortage to instruction list 44. Management PC 14 causes loader 18 to execute the exchange operation based on instruction list 44. Loader 18 is moved between storage section 13 and mounting device 15 along the X-axis rail 19, acquires the current position based on a value of an encoder (not illustrated), and executes a process of replacing feeder 25 in mounting device 15 that is an operation target while transmitting the current position to management PC 14.

Here, during the mounting process of mounting device 15, it may be necessary for an operator to perform some work on mounting device 15. On the other hand, as described above, loader 18 passes in front of mounting device 15 and executes the exchange operation in front of mounting device 15 that is an operation target. Therefore, in mounting device 15 of mounting system 10, work of the operator for mounting device 15 is set to be in a restriction state in which the work of the operator is not accepted in order to secure the safety of the operator or not to hinder the exchange operation of loader 18 during the passage or the exchange operation of loader 18. Next, a process of managing work restriction for an operator by mounting device 15 and a display process in management PC 14 will be described.

Figure 3:
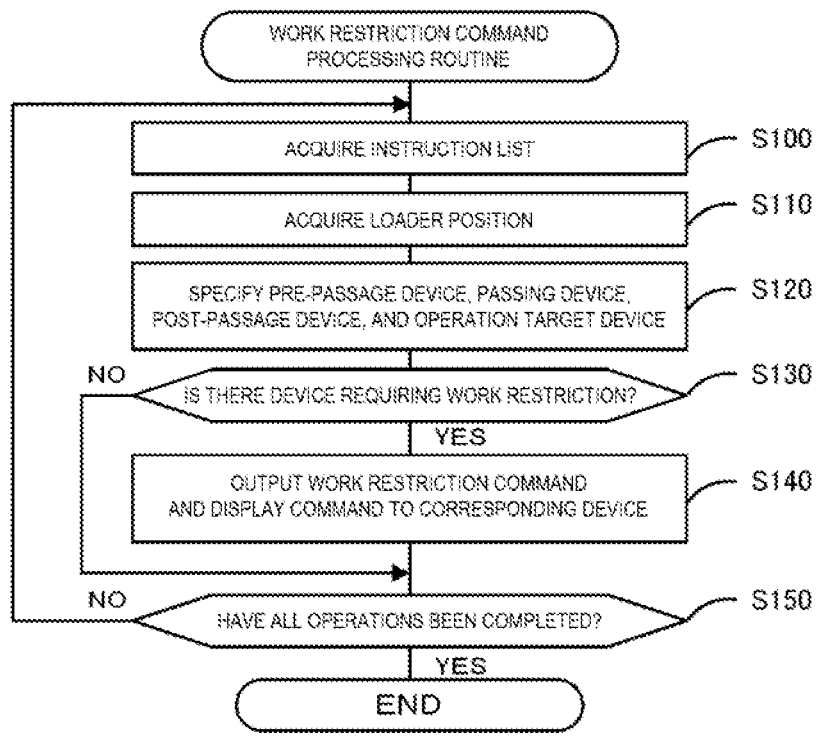
FIG. 3 is a flowchart illustrating an example of a work restriction command processing routine.

FIG. 3 is a flowchart illustrating an example of a work restriction command processing routine executed by management control section 40 of management PC 14. This routine is stored in memory section 43 of management PC 14 and executed after management PC 14 is started. When this routine is started, CPU 41 of management control section 40 acquires instruction list 44 by reading instruction list 44 from memory section 43 (S100), and acquires the current position of loader 18 from positional information 45 (S110). Next, CPU 41 specifies, based on the acquired instruction list 44 and the current position of loader 18, a pre-passage state in which loader 18 is scheduled to pass, a passing state in which loader 18 is passing, a post-passage state immediately after loader 18 passes, and mounting device 15 that is an operation target state to be next operated by loader 18 (S120). CPU 41 recognizes mounting device 15 that is an operation target from instruction list 44. CPU 41 recognizes mounting device 15 before, during, and immediately after the passage from a relationship between the current position of loader 18 and the position of mounting device 15 that is an operation target. Next, CPU 41 determines whether there is a device requiring work restriction for an operator based on the specified information (S130). When there is a device requiring the work restriction for the operator, CPU 41 outputs a work restriction command to mounting device 15 that corresponds to any of pre-passage, passing, immediately post-passage, and an operation target, and outputs a display command including information regarding whether each mounting device 15 corresponds to any of pre-passage, passing, immediately post-passage, and an operation target (S140). After S140 or when there is no device requiring work restriction for the operator in S130, CPU 41 determines whether loader 18 has completed all operations based on operation details remaining in instruction list 44 (S150), and executes the processes in and after S100 when all the operations are not completed. On the other hand, when loader 18 has completed all the operations in S150, CPU 41 ends this routine.

Figure 4:
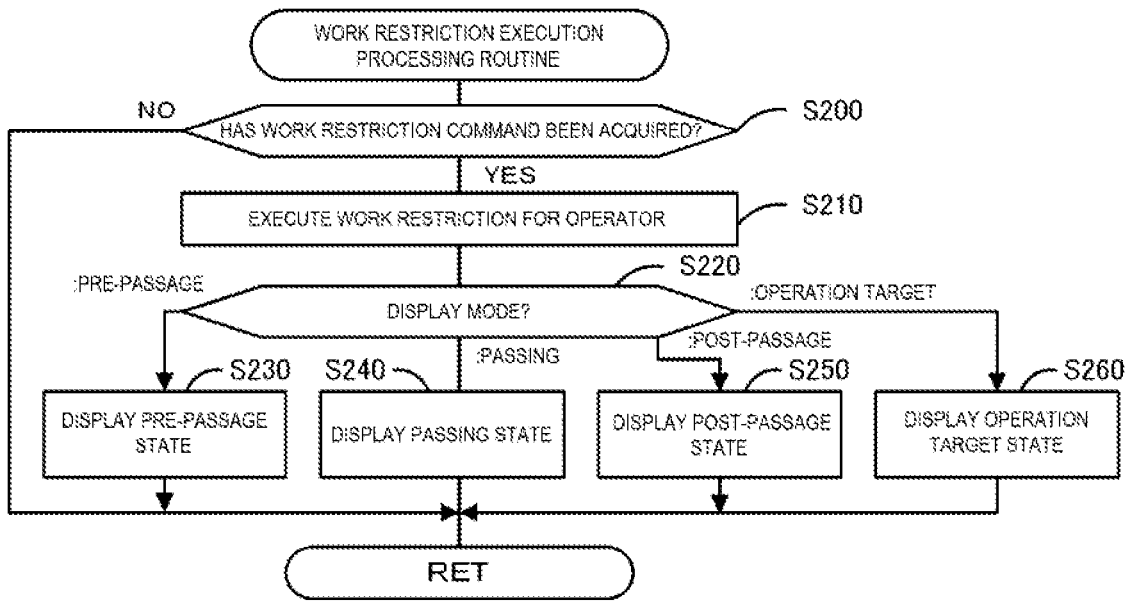
FIG. 4 is a flowchart illustrating an example of a work restriction execution processing routine.

Next, work restriction and a display process for an operator in mounting device 15 will be described. FIG. 4 is a flowchart illustrating an example of a work restriction execution processing routine executed by mounting control section 36 of mounting device 15. This routine is stored in memory section 38 of mounting device 15, and is repeatedly executed at predetermined intervals (for example, 1 sec) after mounting device 15 is started. When this routine is started, CPU 37 of mounting control section 36 determines whether a work restriction command has been acquired from management PC 14 (S200). When the work restriction command has been acquired, CPU 37 executes work restriction for restricting work from the operator in step S210. The work restriction is not particularly limited as long as work of the operator is not accepted, but may include, for example, locking module 22 and restricting sliding-out of module 22. Next, CPU 37 determines whether a display mode displayed on display section 35 is any of pre-passage, passing, immediately post-passage, and an operation target based on the display command (step S220). CPU 37 controls display section 35 in a pre-passage state (S230) when the display mode is the pre-passage, in a passing state (S240) when the display mode is the passing, in a post-passage state (S250) when the display mode is the immediately post-passage, and in an operation target state (S260) when the display mode is the operation target.

After the display process is performed on display section 35 in S230 to S260, or when a work restriction command is not acquired in S200, CPU 37 ends the routine without further processing. When the work restriction command has been acquired up to the previous time and the work restriction command is not acquired this time, CPU 37 cancels the work restriction and the display for the operator.

Figure 5:
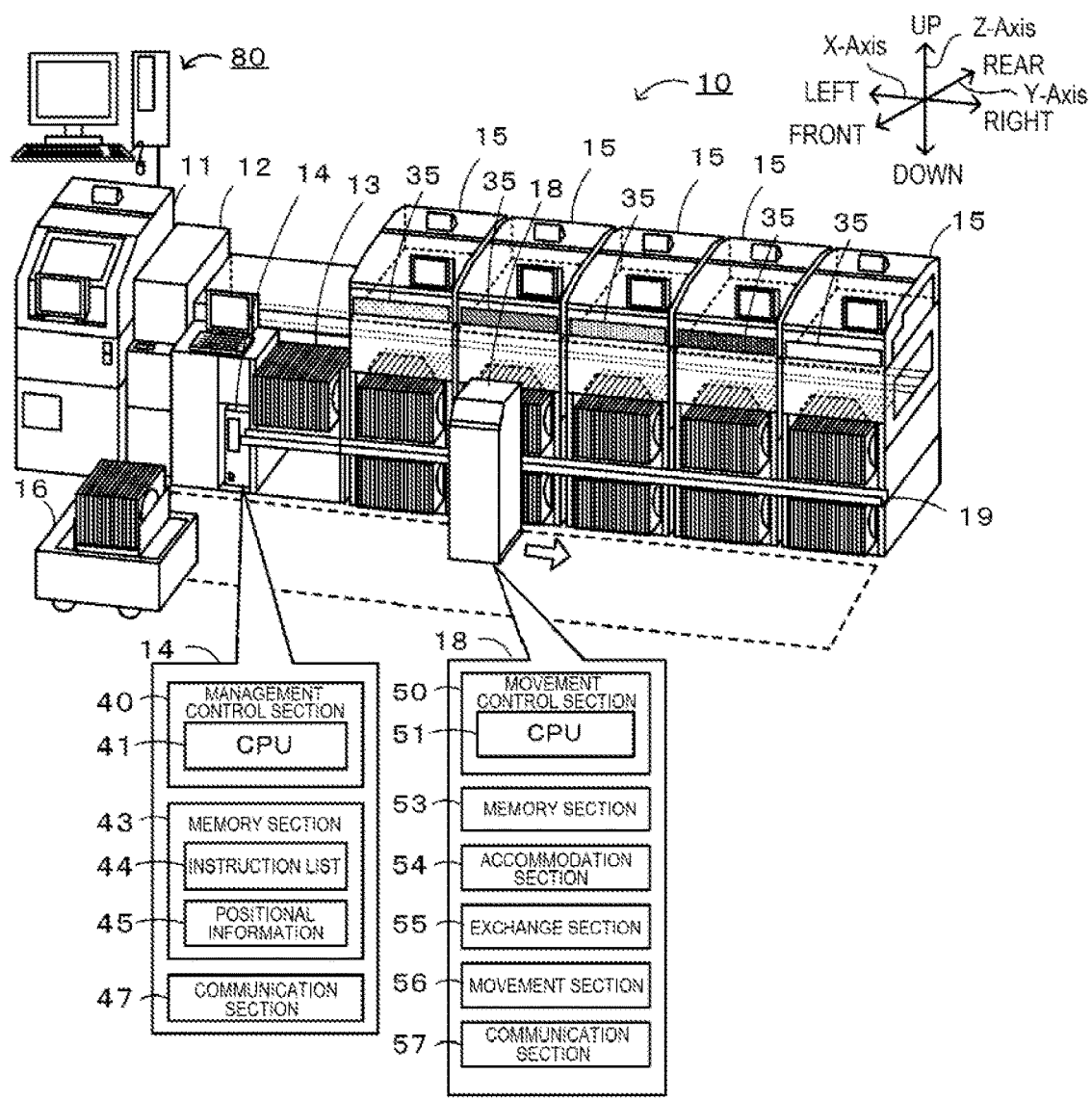
FIG. 5 is an explanatory diagram illustrating an example of displaying a display mode indicating a restriction state on display section 35.

FIG. 5 is an explanatory diagram illustrating an example of displaying a display mode indicating a work restriction state for an operator on display section 35. In FIG. 5, the fourth mounting device 15 from the left is an operation target device, and a state in which loader 18 is being moved rightward from storage section 13 is illustrated. In FIG. 5, work restriction for the operator is executed on the first to fourth mounting devices 15 from the left, and in each mounting device 15, immediately post-passage is displayed on the first display section 35, passing is displayed on the second display section 35, pre-passage is displayed on the third display section 35, and an operation target is displayed on the fourth display section 35 in order from the left. In mounting system 10, display section 35 emits light in different colors as different display modes. A light emission color is preferably a color different from a color emitted by a warning lamp at the time of an error such as blue, green, red, yellow, or the like, and is, for example, dark blue, purple, peach, or orange. A display mode of display section 35 may be any of a difference in light emission mode, a difference in light emission color, a combination thereof, or the like. While loader 18 is moved to mounting device 15 that is an operation target and then executes an exchange operation without being moved, the work restriction for the operator is executed in the fourth mounting device 15 from the left as illustrated in FIG. 1, and an operation target is displayed on display section 35. As described above, by checking a display mode of display section 35, the operator can visually recognize that the work restriction on mounting device 15 is executed and a corresponding state.

Here, correspondences between the constituents of the present embodiment and constituents of the present disclosure will be clarified. Management control section 40 of the present embodiment corresponds to a management control section of the present disclosure, management PC 14 corresponds to a management device, loader 18 corresponds to a mobile work device, and display section 35 corresponds to a display section. Printing device 11, print inspection device 12, storage section unit 13, mounting device 15, and the like correspond to mounting-related devices, and mounting control section 36 corresponds to a device control section. In the present embodiment, an example of the management method and the method for controlling the mounting-related device of the present disclosure is also clarified by describing the operations of management PC 14 and mounting device 15.

In management PC 14 of the present embodiment described above, in a restriction state in which work of an operator on mounting device 15 as a mounting-related device is not accepted due to movement of loader 18 as a moving work device, a display mode indicating the restriction state is displayed on display section 35 of corresponding mounting device 15 to notify the operator of the restriction state. Generally, in mounting device 15, since movement and an exchange operation of loader 18 are performed in the vicinity of mounting device 15, work on mounting device 15 by an operator may be restricted. However, it is not easy for an operator to recognize which mounting device 15 is operable and which device is in a restriction state. In management PC 14, when mounting device 15 is in a state in which work of the operator is restricted due to movement of loader 18, a display mode indicating the restriction state is displayed on display section 35 of corresponding mounting device 15 and the operator is notified of the restriction state. Therefore, in management PC 14, a state of mounting device 15 changed due to the movement of loader 18 can be easily visually recognized.

Management PC 14 causes mounting device 15 corresponding to one or more of a pre-passage state in which loader 18 is scheduled to pass, a passing state in which loader 18 is passing, a post-passage state immediately after loader 18 passes, and an operation target state to be next operated by loader 18, to be in a work restriction state for an operator, and management control section 40 displays a display mode corresponding to the pre-passage state, the passing state, the post-passage state, or the operation target state on the display section 35 of corresponding mounting device 15. In management PC 14, it is possible to notify the operator whether mounting device 15 corresponds to any of the pre-passage state, the passing state, the post-passage state, and the operation target state.

When information indicating that loader 18 passes in front of mounting device 15 is acquired from management PC 14, In mounting device 15 is brought into a restriction state in which work of the operator is not acceptable, and a display mode indicating the restriction state is displayed on display section 35 to notify the operator. Therefore, in mounting device 15, a state of mounting device 15 changed due to movement of loader 18 can be easily visually recognized. Mounting control section 36 sets a restriction state in a case where the mounting device corresponds to one or more the pre-passage state, the passing state, the post-passage state, and the operation target state of loader 18, and displays, on display section 35, display modes corresponding to one or more of the pre-passage state, the passing state, the post-passage state, and the operation schedule state. In mounting device 15, it is possible to notify the operator whether mounting device 15 corresponds to any of the pre-passage state, the passing state, the post-passage state, and the operation target state.

Since mounting system 10 includes management PC 14, mounting device 15, and loader 18 described above, a state of mounting device 15 changed due to movement of loader 18 can be easily visually recognized. Since display section 35 is an LED tape disposed on a passage face through which loader 18 passes, an operator can be notified of the restriction state of the device by using the LED tape.

Needless to say, the present disclosure is not limited to the embodiment that has been described heretofore in any way and may be implemented in various forms without departing from the technical scope of the present disclosure.

For example, in the above embodiment, work of an operator is restricted by the pre-passage state, the passing state, the post-passage state, and the operation target state of loader 18, but any one or more of these may be omitted, such as the post-passage state, or other states may be added. A display mode of display section 35 may be omitted correspondingly, and in this mounting device 15, it is preferable to execute work restriction for an operator in the pre-passage state, the passing state, and the operation target state.

Figure 6:
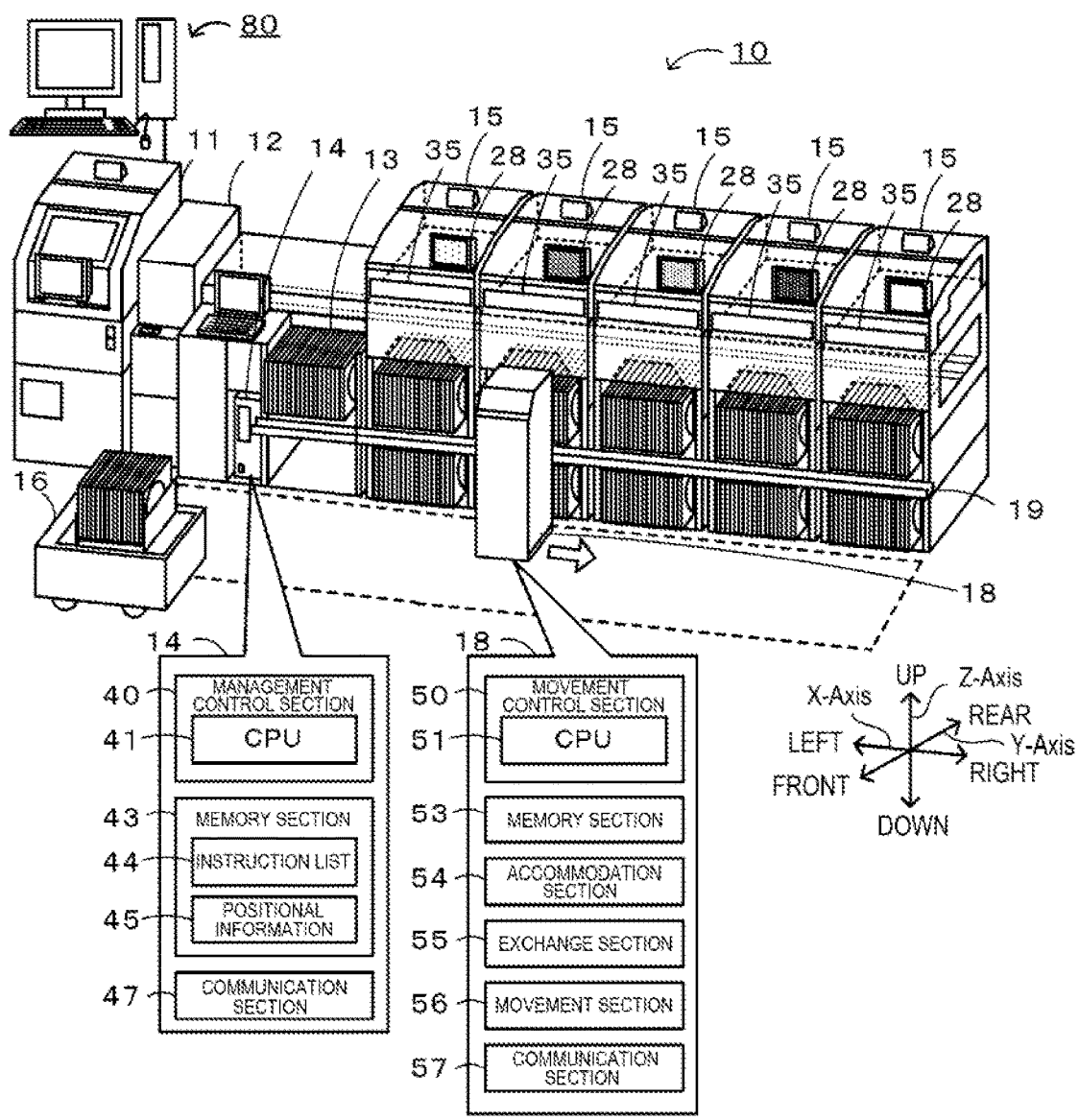
FIG. 6 is an explanatory diagram of an example of displaying a display mode indicating a restriction state on operation panel 28.

In the above embodiment, display section 35 is an LED tape which is a one-dimensional (linear) light emitting member capable of emitting light of various colors, but is not particularly limited to this, and may be a display capable of displaying an image. Examples of the display include operation panel 28. FIG. 6 is an explanatory diagram illustrating an example of displaying a display mode indicating a restriction state for an operator on operation panel 28. As illustrated in FIG. 6, a display mode indicating the restriction state for the operator may be displayed by changing a display color of operation panel 28. The restriction state may be displayed by using characters, graphics, or the like, but as illustrated in FIGS. 5 and 6, the restriction state is displayed by a light emission color, which is easier for an operator to visually recognize.

In the above embodiment, the function of the management device of the present disclosure has been described as being provided in management PC 14, but is not particularly limited to this, and may be provided in a mounting-related device such as mounting device 15, may be provided in loader 18, or may be provided in host PC 80.

In the above embodiment, mounting device 15 is mainly described as a mounting-related device of the present disclosure, but is not particularly limited to this, and a display section may be provided in printing device 11, print inspection device 12, a mounting inspection device (not illustrated), a reflow device, or the like to display the restriction state. In the above embodiment, loader 18 has been described as performing automatic attachment and detachment of feeder 25, but is not particularly limited to this, and may perform automatic attachment and detachment of members to be attached to printing device 11, print inspection device 12, a mounting inspection device (not illustrated), a reflow device, or the like.

In the above embodiment, the present disclosure has been described as mounting system 10, management PC 14, and mounting device 15, but the present disclosure may be a management method executed by management PC 14 or a program for realizing a method for controlling mounting device 15 executed by mounting device 15.

Here, the management device, the mounting-related device, the mounting system, the management method, and the method for controlling the mounting-related device of the present disclosure may be configured as follows. For example, in the management device of the present disclosure, the mounting-related device may be brought into the restriction state in a case where the mounting-related device corresponds to one or more of a pre-passage state in which the moving work device is scheduled to pass, a passing state in which the moving work device is passing, a post-passage state immediately after the moving work device passes, and an operation target state in which the mounting-related device is to be operated by the moving work device, and the management control section may display a display mode corresponding to one or more of the pre-passage state, the passing state, the post-passage state, and the operation target state on the display section of the corresponding mounting-related device. In this management device, it is possible to notify an operator whether the mounting-related device corresponds to any of the pre-passage state, the passing state, the post-passage state, and the operation target state. Here, the display mode may include, for example, a difference in light emission mode such as constant lighting, blinking at different time intervals, flow lighting in a predetermined direction (sequential lighting), a difference in light emission color, and a combination thereof. It is preferable that the display mode corresponding to the restriction state is different from a display mode at the time of device abnormality. A correspondence between display modes of the display section and various device states may be selectable by an operator.

The mounting-related device of the present disclosure is a mounting-related device used in a mounting system including a moving work device and a management device, the moving work device being configured to move between multiple mounting-related devices to automatically attach and detach a member to and from an attachment portion, the multiple mounting-related devices being related to a process of mounting a component on a processing target object, a management device being configured to manage any of the mounting-related devices and the moving work device, and the mounting-related device includes a display section configured to visually notify an operator of information, and a device control section configured to, when information indicating that the moving work device passes in front of the mounting-related device is acquired from the moving work device and/or the management device, set a restriction state in which work of the operator is not accepted and display a display mode indicating the restriction state on the display section to notify the operator of the restriction state.

In the mounting-related device, when information indicating that the moving work device passes in front of the mounting-related device is acquired from at least one of the moving work device and the management device, the restriction state in which work of the operator is not accepted and the display mode indicating the restriction state is displayed on the display section to notify the operator. Therefore, in this mounting-related device, a state of the mounting-related device changed due to movement of the moving work device can be easily visually recognized.

In the mounting-related device of the present disclosure, the device control section may set the restriction state in a case where the mounting-related device corresponds to one or more of a pre-passage state in which the moving work device is scheduled to pass, a passing state in which the moving work device is passing, a post-passage state immediately after the moving work device passes, and an operation target state in which the mounting-related device is to be operated by the moving work device, and display a display mode corresponding to one or more of the pre-passage state, the passing state, the post-passage state, and the operation target state on the display section. In this mounting-related device, it is possible to notify the operator whether the mounting-related device corresponds to any of the pre-passage state, the passing state, the post-passage state, and the operation target state.

The mounting system of the present disclosure includes any one of the management devices described above, any one of the mounting-related devices described above, and a moving work device configured to move between the multiple mounting-related devices to automatically attach and detach the member to and from the attachment portion. In this mounting system, since any one of the management devices described above and any one of the mounting-related devices described above are provided, a state of the mounting-related device changed due to movement of the moving work device can be easily visually recognized. It is possible to achieve an effect corresponding to the employed device.

In the mounting system of the present disclosure, the display section may be an LED tape disposed on a passage face through which the moving work device passes. In this management device, the operator can be notified of the restriction state of the device by using the LED tape. Here, the LED tape may be a one-dimensional (linear) light emitting member capable of emitting light of various colors. Alternatively, the display section may be a display capable of displaying an image.

A management method of the present disclosure is a management method used for a mounting system including multiple mounting-related devices and a moving work device, the multiple mounting-related devices each including a display section configured to visually notify an operator of information and an attachment portion to which a member is attached, the multiple mounting-related devices being related to a process of mounting a component on a processing target object, the moving work device being configured to move between the multiple mounting-related devices to automatically attach and detach the member to and from the attachment portion, and the method includes a step of, when a mounting-related device is in a restriction state in which work of an operator on the mounting-related device is not acceptable due to movement of the moving work device, displaying a display mode indicating the restriction state on the display section of the corresponding mounting-related device to notify the operator of the restriction state.

In this management method, similarly to the management device described above, a state of the mounting-related device changed due to movement of the moving work device can be easily visually recognized. This management method may employ the above mode of the management device, or may include a step of realizing the above functions of the management device.

A method for controlling a mounting-related device of the present disclosure is a method for controlling a mounting-related device used in a mounting system including a moving work device and a management device, the moving work device being configured to move between multiple mounting-related devices, the multiple mounting-related devices each including a display section configured to visually notify an operator of information, the multiple mounting-related devices being related to a process of mounting a component on a processing target object, the moving work device being configured to automatically attach and detach a member to and from an attachment portion, the management device being configured to manage any of the mounting-related devices and the moving work device, and the method includes a step of, when information indicating that the moving work device passes in front of the mounting-related device is acquired from the moving work device and/or the management device, setting a restriction state in which work of the operator is not accepted and displaying a display mode indicating the restriction state on the display section to notify the operator of the restriction state.

In this method for controlling the mounting-related device, similarly to the mounting-related device described above, a state of the mounting-related device changed due to movement of the moving work device can be easily visually recognized. The method for controlling the mounting-related device may employ the above mode of the mounting-related device described above, or may include a step of realizing the above functions of the mounting-related device.

INDUSTRIAL APPLICABILITY

The management device, the mounting-related device, the mounting system, the management method, and the method for controlling the mounting-related device of the present disclosure can be used in the field of mounting electronic components.

REFERENCE SIGNS LIST

10: mounting system, 11: printing device, 12: print inspection device, 13: storage section, 14: management PC, 15: mounting device, 16: automatic conveyance vehicle, 18: loader, 19: X-axis rail, 21: base, 22: module, 23: board processing section, 24: component supply section, 25: feeder, 26: buffer section, 28: operation panel, 30: mounting section, 31: head moving section, 32: mounting head, 33: nozzle, 35: display section, 36: mounting control section, 37: CPU, 38: memory section, 39: communication section, 40: management control section, 41: CPU, 43: memory section, 44: instruction list, 45: positional information, 47: communication section, 50: movement control section, 51: CPU, 53: memory section, 54: accommodation section, 55: exchange section, 56: movement section, 57: communication section, 80: host PC, P: component, S: board.

The invention claimed is:

1. A management device used in a mounting system including a plurality of mounting-related devices and a moving work device, each mounting-related device of the plurality of mounting-related devices including a display section configured to visually notify an operator of information and an attachment portion to which a member is attached, the plurality of mounting-related devices being related to a process of mounting a component on a processing target object, the moving work device being configured to move between the plurality of mounting-related devices to automatically attach and detach the member to and from the attachment portion, the management device comprising:
   a management control section configured to
      acquire an instruction list,
      acquire a current position of the moving work device,
      specify, based on the acquired instruction list and the current position of the moving work device, information including a pre-passage state in which the moving work device is scheduled to pass, a passing state in which the moving work device is passing, a post-passage state immediately after the moving work device passes, and an operation target state in which one of the mounting-related devices among the plurality of mounting-related devices is to be operated by the moving work device, determine whether any of the mounting-related devices among the plurality of mounting-related devices is in a restriction state in which work of the operator on a corresponding mounting-related device is not accepted due to movement of the moving work device based on the specified information, and when it is determined that the corresponding mounting-related device is in the restriction state, display a display mode indicating the restriction state on the display section of the corresponding mounting-related device to notify the operator of the restriction state.

2. The management device according to claim 1, wherein the management control section is configured to display the display mode corresponding to one or more of the pre-passage state, the passing state, the post-passage state, and the operation target state on the display section of the corresponding mounting-related device.

3. A mounting system comprising:

the management device according to claim 1;

a plurality of mounting-related devices being related to a process of mounting a component on a processing target object, a each of the mounting-related devices including:

a display section configured to visually notify an operator of information;

an attachment portion to which a member is attached; and a device control section configured to determine whether a work restriction command has been acquired, set a restriction state in which work of the operator is not accepted when it is determined that the work restriction command has been acquired, and display a display mode indicating the restriction state on the display section to notify the operator of the restriction state; and a moving work device configured to move between the plurality of mounting-related devices to automatically attach and detach the member to and from the attachment portion.

4. The mounting system according to claim 3, wherein the display section is an LED tape disposed on a passage face through which the moving work device passes.

5. The management device according to claim 1, wherein the display modes for the pre-passage state, the passing state, the post-passage state, and the operation target state on the display section of the corresponding mounting-related device are different colors.

6. A mounting-related device used in a mounting system including a moving work device and a management device, the moving work device being configured to move between multiple mounting-related devices to automatically attach and detach a member to and from an attachment portion, the multiple mounting-related devices being related to a process of mounting a component on a processing target object, the management device being configured to manage any of the mounting-related devices and the moving work device, the mounting-related device comprising:

a display section configured to visually notify an operator of information;

an attachment portion to which a member is attached; and a device control section configured to determine whether a work restriction command has been acquired from at least one of the moving work device and the management device, set a restriction state in which work of the operator is not accepted when it is determined that the work restriction command has been acquired, and display a display mode indicating the restriction state on the display section to notify the operator of the restriction state, wherein the device control section sets the restriction state in a case where the mounting-related device corresponds to one or more of a pre-passage state in which the moving work device is scheduled to pass, a passing state in which the moving work device is passing, a post-passage state immediately after the moving work device passes, and an operation target state in which the mounting-related device is to be operated by the moving work device, and displays the display mode corresponding to one or more of the pre-passage state, the passing state, the post-passage state, and the operation schedule state on the display section.

7. The mounting-related device according to claim 6, wherein the display modes for the pre-passage state, the passing state, the post-passage state, and the operation target state on the display section of the corresponding mounting-related device are different colors.

8. The mounting-related device according to claim 6, wherein the restriction state includes at least one of locking a module of the mounting-related device and restricting sliding-out of the module.

9. A management method used for a mounting system including a plurality of mounting-related devices and a moving work device, each mounting-related device of the plurality of mounting-related devices including a display section configured to visually notify an operator of information and an attachment portion to which a member is attached, the plurality of mounting-related devices being related to a process of mounting a component on a processing target object, the moving work device being configured to move between the plurality of mounting-related devices to automatically attach and detach the member to and from the attachment portion, the method comprising:

acquiring an instruction list;

acquiring a current position of the moving work device;

specifying, based on the acquired instruction list and the current position of the moving work device, information including a pre-passage state in which the moving work device is scheduled to pass, a passing state in which the moving work device is passing, a post-passage state immediately after the moving work device passes, and an operation target state in which one of the mounting-related devices among the plurality of mounting-related devices is to be operated by the moving work device;

determining whether any of the mounting-related devices among the plurality of mounting-related devices is in a restriction state in which work of the operator on a corresponding mounting-related device is not accepted due to movement of the moving work device based on the specified information; and when it is determined that the corresponding mounting-related device is in the restriction state, displaying a display mode indicating the restriction state on the display section of the corresponding mounting-related device to notify the operator of the restriction state.

10. A method for controlling a mounting-related device used in a mounting system including a moving work device and a management device, the moving work device being configured to move between multiple mounting-related devices, the multiple mounting-related devices including a display section configured to visually notify an operator of information, the multiple mounting-related devices being related to a process of mounting a component on a processing target object, the moving work device being configured to automatically attach and detach a member to and from an attachment portion, the management device being configured to manage any of the mounting-related devices and the moving work device, the method comprising:

determining whether a work restriction command has been acquired from at least one of the moving work device and the management device;

setting a restriction state in which work of the operator is not accepted when it determined that the work restriction command has been acquired; and displaying a display mode indicating the restriction state on the display section to notify the operator of the restriction state, wherein the restriction state is set in a case where the mounting-related device corresponds to one or more of a pre-passage state in which the moving work device is scheduled to pass, a passing state in which the moving work device is passing, a post-passage state immediately after the moving work device passes, and an operation target state in which the mounting-related device is to be operated by the moving work device, and the display mode corresponds to one or more of the pre-passage state, the passing state, the post-passage state, and the operation schedule state on the display section.

* * * * *